(12) United States Patent
Leong et al.

(10) Patent No.: US 11,094,652 B1
(45) Date of Patent: Aug. 17, 2021

(54) CONFIGURABLE RADIO TRANSCEIVER AND METHOD THEREOF

(71) Applicant: Realtek Semiconductor Corp., Hsinchu (TW)

(72) Inventors: Poh Boon Leong, Pleasanton, CA (US); Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/937,647

(22) Filed: Jul. 24, 2020

(51) Int. Cl.
| | |
|---|---|
| *H01L 23/50* | (2006.01) |
| *H01L 23/34* | (2006.01) |
| *H01L 23/66* | (2006.01) |
| *H01Q 1/22* | (2006.01) |
| *H05K 1/02* | (2006.01) |
| *H03F 3/24* | (2006.01) |
| *H01L 21/48* | (2006.01) |
| *H04B 1/40* | (2015.01) |

(52) U.S. Cl.
CPC .......... *H01L 23/66* (2013.01); *H01L 21/4853* (2013.01); *H01Q 1/22* (2013.01); *H03F 3/245* (2013.01); *H04B 1/40* (2013.01); *H05K 1/0243* (2013.01); *H01L 2223/6611* (2013.01); *H01L 2223/6627* (2013.01); *H01L 2223/6655* (2013.01); *H01L 2223/6677* (2013.01); *H03F 2200/294* (2013.01); *H03F 2200/451* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 7,119,448 B1* | 10/2006 | de Stasi | ............... | H01L 23/645 257/784 |
| 7,170,166 B2* | 1/2007 | Rofougaran | ............ | H01L 23/50 257/728 |
| 7,304,393 B1* | 12/2007 | Greene | ................. | H03B 5/124 257/784 |
| 7,924,113 B2* | 4/2011 | Chou | ...................... | H04B 3/14 333/28 R |
| 8,005,437 B2* | 8/2011 | Rofougaran | ........ | H01P 1/20372 455/76 |
| 8,115,566 B2* | 2/2012 | Chou | ...................... | H04B 3/14 333/28 R |
| 8,324,982 B2* | 12/2012 | Chou | ...................... | H04B 3/14 333/28 R |

(Continued)

*Primary Examiner* — Tuan A Tran

(74) *Attorney, Agent, or Firm* — McClure, Qualey & Rodack, LLP

(57) ABSTRACT

A radio frequency integrated circuit includes a transmitter integrated on a die, the transmitter circuit being controlled by a first logical signal and configured to receive a to-be-transmitted signal and output a first voltage at a first internal node; a receiver integrated on the die. The receiver circuit is controlled by the first logical signal and a second logical signal and configured to output a receive signal. A first pad, a second pad, and a first inductor integrated on the die, the first pad being connected to the first internal node, the second pad being connected to the second internal node, and the first inductor being placed across the first internal node and the second internal node.

20 Claims, 6 Drawing Sheets

(56) References Cited

U.S. PATENT DOCUMENTS

| | | | | |
|---|---|---|---|---|
| 8,427,235 B2* | 4/2013 | Williams | .............. | H03F 3/2173 |
| | | | | 330/251 |
| 8,549,447 B2* | 10/2013 | Eisenstadt | ........... | H01L 27/0296 |
| | | | | 716/100 |
| 8,564,091 B2* | 10/2013 | Sutardja | .................. | H01L 24/49 |
| | | | | 257/531 |
| 8,593,220 B2* | 11/2013 | Williams | ................ | H01L 24/49 |
| | | | | 330/251 |
| 8,757,501 B2* | 6/2014 | McCormack | ............ | H01Q 1/40 |
| | | | | 235/492 |
| 8,817,891 B2* | 8/2014 | Tam | ......................... | H04B 5/02 |
| | | | | 375/256 |
| 8,897,700 B2* | 11/2014 | McCormack | ........... | G01S 13/04 |
| | | | | 455/41.1 |
| 9,231,533 B2* | 1/2016 | Zhang | ....................... | H03F 3/21 |
| 9,281,285 B1* | 3/2016 | Atesal | ..................... | H01L 23/66 |
| 9,322,904 B2* | 4/2016 | McCormack | ........... | H04B 5/00 |
| 9,444,523 B2* | 9/2016 | McCormack | ........ | H04B 5/0025 |
| 9,576,915 B2* | 2/2017 | Huang | .................... | G06F 30/33 |
| 9,614,590 B2* | 4/2017 | McCormack | ............ | H01Q 5/25 |
| 9,646,947 B2* | 5/2017 | Bandholz | ................ | H01L 25/50 |
| 9,722,667 B2* | 8/2017 | McCormack | ............ | H04B 5/00 |
| 9,735,145 B2* | 8/2017 | Dupuis | ............... | H01L 27/0255 |
| 10,381,713 B2* | 8/2019 | McCormack | ........ | H01Q 9/0485 |
| 10,439,065 B2* | 10/2019 | Tellkamp | ............. | H01L 29/7846 |
| 10,601,105 B2* | 3/2020 | McCormack | ........ | H04B 5/0037 |
| 2013/0252562 A1* | 9/2013 | Hasson | .................... | H04B 1/44 |
| | | | | 455/78 |
| 2020/0366259 A1* | 11/2020 | Sun | ......................... | H03F 3/195 |

* cited by examiner

CONFIGURABLE RADIO TRANSCEIVER AND METHOD THEREOF

BACKGROUND OF THE DISCLOSURE

Field of the Disclosure

The present disclosure generally relates to radio transceivers and more particularly to a radio transceiver and method having a flexible configuration.

Description of Related Art

As depicted in FIG. 1A, a conventional radio transmitter 100A comprises a power amplifier (PA) that amplifies a first RF (radio frequency) signal $X_1$ into a second RF signal $X_2$, and a transmitting antenna 111 that radiates the second RF signal $X_2$ unto the air. As depicted in FIG. 1B, a radio receiver 100B comprises a receiving antenna 121 that picks up a third RF signal $X_3$ from the air, and a low-noise amplifier (LNA) 141 that amplifies the third RF signal $X_3$ into a fourth RF signal $X_4$. A radio transceiver embodies both a radio transmitter and a radio receiver, and there can be a two-antenna embodiment and a one-antenna embodiment. In a two-antenna embodiment, a radio transceiver comprises a combination of radio transmitter 100A of FIG. 1A and a radio receiver 100B of FIG. 1B. This way, there are two antennas, one for transmitting and the other for receiving. This two-antenna embodiment is more expensive, but may lead to a better performance, because radio transmitter 100A and ratio receiver 100B are separate and can be optimized independently. In a one-antenna embodiment as depicted in FIG. 1C, a radio transceiver 100C comprises a power amplifier (PA) 151, a low-noise amplifier (LNA) 161, a co-share network 171, and an antenna 181. PA 151 receives a fifth signal $X_5$ and amplifies into a sixth signal $X_6$. LNA 161 receives a seventh signal $X_7$ and amplifies into an eighth signal $X_8$. The co-share network 171 functions as both an interface between the antenna 181 and the PA 151 and an interface between the antenna 181 and the LNA 161. This one-antenna embodiment is more cost effective, but more difficult to design, since the transmitter and the receiver are not separate and cannot be optimized independently. Radio transceiver 100C may operate in two duplexing schemes: the first scheme is frequency domain duplexing (FDD), wherein a transmitter function and a receiver function are activated at the same time, PA 151 and the LNA 161 are simultaneously turned on, but the fifth RF signal $X_5$ and the eighth RF signal $X_8$ are of a different frequency; the second scheme is time domain duplexing (TDD), wherein a transmitter function and a receiver function are not activated at the same time, PA 151 and the LNA 161 are turned on alternately, and the fifth RF signal $X_5$ and the eighth RF signal $X_8$ are of the same frequency. This present disclosure is directed to the TDD scheme. During a time when the transmitter function is activated, the PA 151 is turned on, the LNA 161 is turned off, the co-share network 171 relays the sixth RF signal $X_6$ into a ninth RF signal $X_9$ that is radiated to the air by the antenna 181. During a time when the receiver function is activated, the PA 151 is turned off, the LNA 161 is turned on, and the ninth RF signal $X_9$ is picked up by the antenna 181, and the co-share network 171 relays the ninth RF signal $X_9$ into the seventh RF signal $X_7$. To efficiently relay the sixth RF signal $X_6$ into the ninth RF signal $X_9$ when the transmitter function is activated, the co-share network 171 must effectively mitigate a loading effect from the LNA 161. Likewise, to efficiently relay the ninth RF signal $X_9$ into the seventh RF signal $X_7$ when the receiver function is activated, the co-share network 171 must effectively mitigate a loading effect from the PA 151.

Modern radio transceivers rely on a high level of integration and utilize packaged radio frequency integrated circuits (RFIC) to reduce costs and form factors, wherein integrated circuits that embody a radio transceiver function are packaged as an electronic component that can be soldered on a printed circuit board. The two-antenna embodiment and the one-antenna embodiment of radio transceiver obviously need to use different printed circuit boards. However, it is highly desirable if the same packaged integrated circuits can be used in either embodiment.

What is desired are a circuit and method of using the same packaged integrated circuits for both the two-antenna embodiment and the one-antenna embodiment.

BRIEF DESCRIPTION OF THIS DISCLOSURE

In an embodiment, a radio frequency integrated circuit (RFIC) comprises a transmitter integrated on a die, the transmitter circuit being controlled by a first logical signal and configured to receive a to-be-transmitted signal and output a first voltage at a first internal node; a receiver integrated on the die, the receiver circuit being controlled by the first logical signal and a second logical signal and configured to receive a second voltage from a second internal node and output a received signal; a first pad, a second pad, and a first inductor integrated on the die, the first pad being connected to the first internal node, the second pad being connected to the second internal node, and the first inductor being placed across the first internal node and the second internal node; a first bond-wire that bonds the first pad to a first pin of a package; a second bond-wire that bonds the second pad to a second pin of the package, and a third bond-wire that bonds the first pad to the second pin of the package.

In an embodiment, a method of integrating a radio frequency integrated circuits (RFIC) comprises: integrating a transmitter on a die, the transmitter circuit being controlled by a first logical signal and configured to receive a to-be-transmitted signal and output a first voltage at a first internal node; integrating a receiver on the die, the receiver circuit being controlled by the first logical signal and a second logical signal and configured to receive a second voltage from a second internal node and output a received signal; integrating a first pad, a second pad, and a first inductor on the die, the first pad being connected to the first internal node, the second pad being connected to the second internal node, and the first inductor being placed across the first internal node and the second internal node; using a first bond-wire to bond the first pad to a first pin of a package; using a second bond-wire to bond the second pad to a second pin of the package; and using a third bond-wire to bond the first pad to the second pin of the package.

DETAILED DESCRIPTION OF THIS DISCLOSURE

Figure 1A:
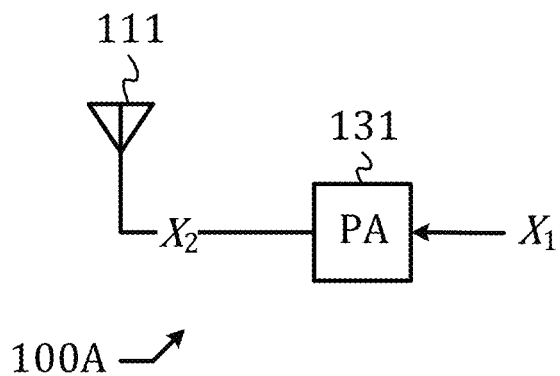
FIG. 1A shows a functional block diagram of a conventional radio transmitter.
Figure 1B:
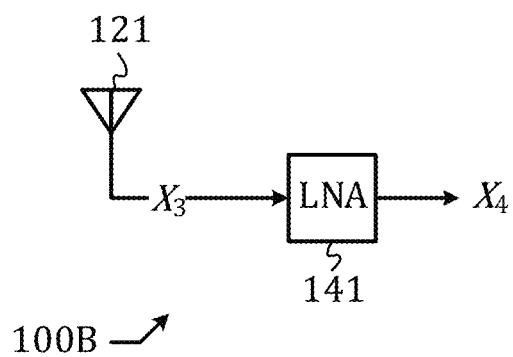
FIG. 1B shows a functional block diagram of a conventional radio receiver.
Figure 1C:
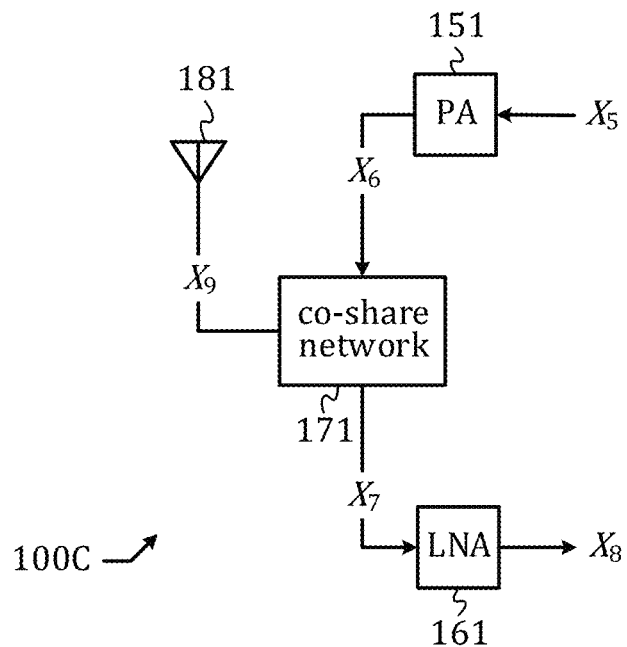
FIG. 1C shows a functional block diagram of a radio conventional transceiver.

The present disclosure is directed to radio transceivers. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "inductor," "capacitor," "balun transformer," "inverter," "amplifier," "cascode," "common-source amplifier," "differential," "single-ended" "logical signal," and "switch." Terms like these are used in a context of microelectronics, and the associated concepts are apparent to those of ordinary skills in the art and thus will not be explained in detail here.

Those of ordinary skill in the art can recognize a capacitor symbol, an inductor symbol, a balun transformer symbol, and can recognize a MOS (metal-oxide semiconductor) transistor symbol, for both PMOS transistor and NMOS transistor, and identify the "source," the "gate," and the "drain" terminals thereof. Those of ordinary skills in the art can read schematics of a circuit comprising components such as capacitors, inductors, NMOS transistors, PMOS transistors, and so on, and do not need a verbose description about how one component connects with another in the schematics.

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

An active circuit comprises a NMOS transistor, a PMOS transistor, or both properly biased and configured as a gain device. An active circuit must receive a current from a power supply node and return the current via a ground node; the active device is said to work in a power domain across the power supply node and the ground node. A ground node is a circuit node of a voltage that is approximately zero but might have a small high-frequency fluctuation. A power supply node is a circuit node of a voltage that is approximately equal to a power supply voltage that is higher than zero but might have a small high-frequency fluctuation.

Throughout this disclosure, "$V_{DD1}$" denotes a first power supply node, "$V_{DD2}$" denotes a second power supply node, "$V_{SS1}$" denotes a first ground node, "$V_{SS2}$" denotes a second ground node. In this disclosure, depending on a context that is apparent to those of ordinary skill in the art, sometimes $V_{DD1}$ refers to the voltage level at the first power supply node $V_{DD1}$. For instance, it is apparent that when we say V DD1 is 3.3V" we mean that the voltage level at the first power supply node $V_{DD1}$ is 3.3V.

In this present disclosure, a signal is a voltage of a variable level that carry a certain information and can vary with time. A level of the signal at a moment represents a state of the signal at that moment. The term "voltage" and the term "signal" are interchangeable in this present disclosure provided a level of said voltage is variable, carries a certain information, and can vary with time.

A logical signal is a voltage signal of two states: a low state and a high state. The low state is also referred to as a "0" state, while the high stage is also referred to as a "1" state. Regarding a logical signal Q, when we say, "Q is high" or "Q is low," what we mean is "Q is in the high state" or "Q is in the low state." Likewise, when we say, "Q is 1" or "Q is 0," what we mean is "Q is in the 1 state" or "Q is in the 0 state."

A logical signal is said to be asserted when it is in the high state, and de-asserted when it is in the low state.

As is known, a switch is a device having two possible states: "on" and "off." A switch is approximately a short circuit when it is in the "on" state and approximately an open circuit when it is in the "off" state. A switch can be embodied using either a NMOS transistor or a PMOS transistor. When a MOS transistor, either a NMOS transistor or a PMOS transistor, is used to embody a switch, it is controlled by a control signal that is a logical signal applied at a gate of the MOS transistor. A switch embodied by a NMOS transistor is in an "on" state when the control signal is high, and in an "off" state when the control signal is low. A switch embodied by a PMOS transistor is in an "on" state when the control signal is low, and in an "off" state when the control signal is high.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A circuit is a collection of a transistor, a resistor, and/or other electronic devices inter-connected in a certain manner to embody a certain function.

Figure 2A:
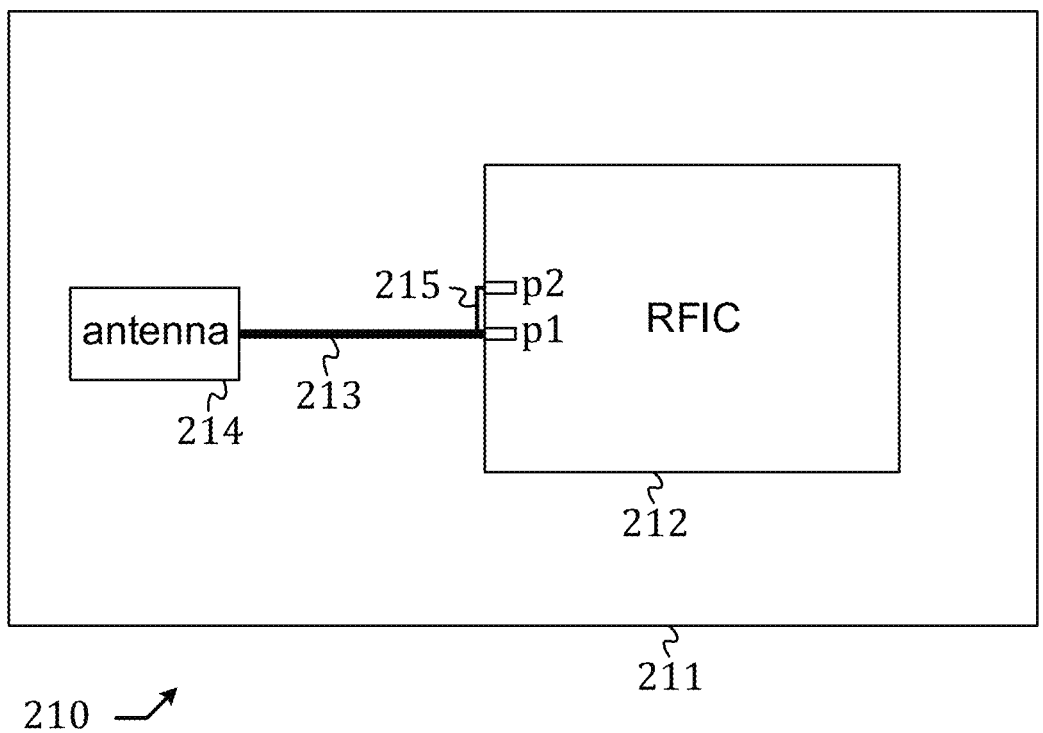
FIG. 2A shows a first configuration of radio transceiver in accordance with an embodiment of the present disclosure.

An objective of the present invention is to have a RFIC (radio frequency integrated circuits) that can be used in various configurations of radio transceiver. The RFIC has a plurality of pins, via which the RFIC is soldered on a printed circuit board (hereafter, PCB), said plurality of pins including a first pin labeled by "p1" and a second pin labeled by "p2." In a first configuration 210 shown in FIG. 2A, a RFIC 212 is soldered on a PCB 221, with the first pin "p1" being connected to antenna 214 via transmission line 213, and the second pin "p2" being shorted to the first pin "p1" via as a short trace 215 laid out on PCB 211. This is a one-antenna radio transceiver configuration wherein antenna 214 functions as both a transmitting antenna and a receiving antenna.

Figure 2B:
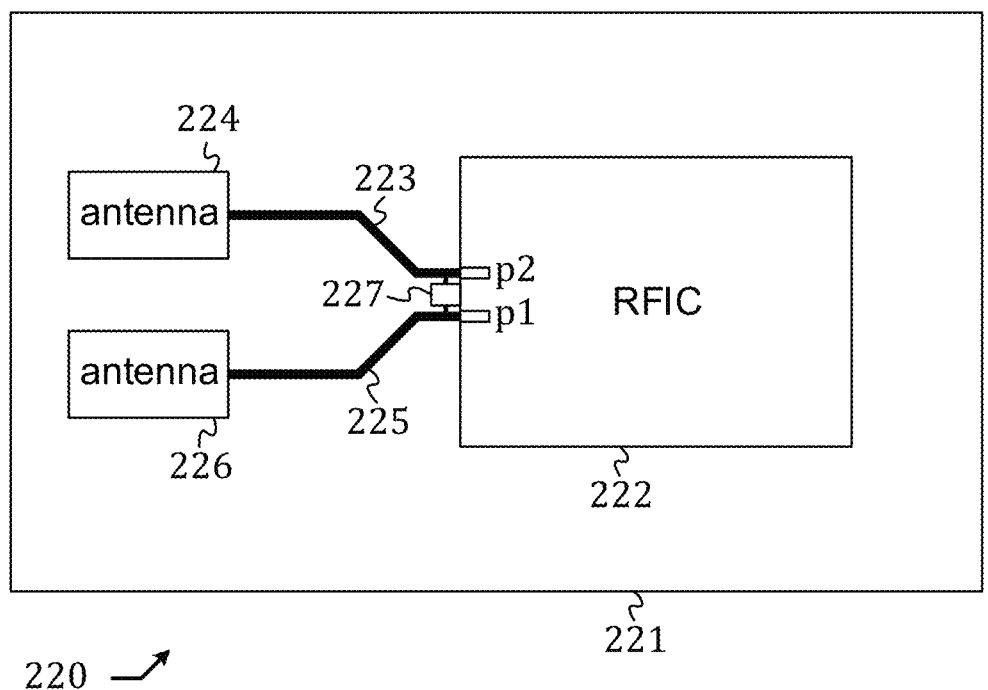
FIG. 2B shows a second configuration of radio transceiver in accordance with an embodiment of the present disclosure.

In a second configuration as shown in FIG. 2B, a RFIC 222 is soldered on PCB 221, with the first pin "p1" being connected to antenna 226 via transmission line 225, the second pin "p2" being connected to antenna 224 via transmission line 223, and the second pin "p2" being coupled to the first pin "p1" via an on-board component 227. This is a two-antenna radio transceiver configuration, wherein antenna 226 is a transmitting antenna and antenna 214 is a receiving antenna.

Figure 2C:
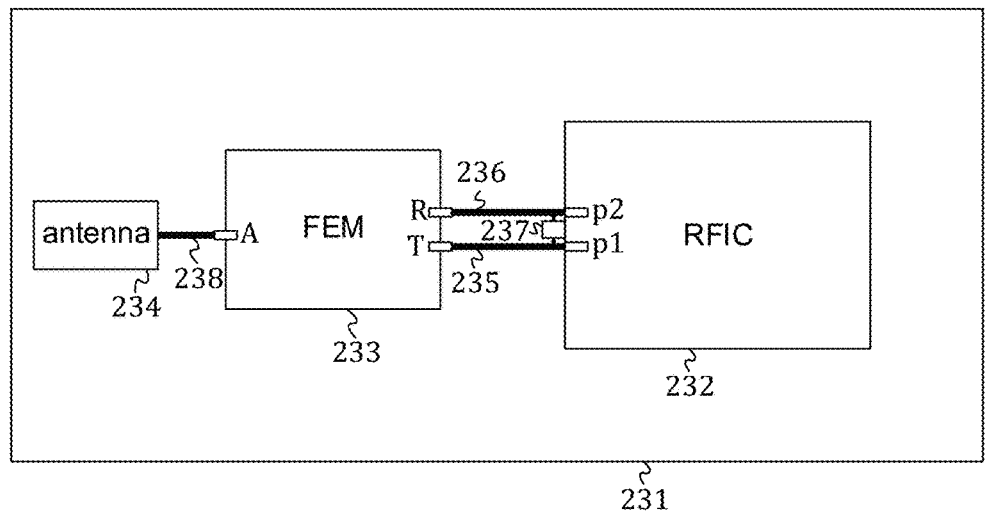
FIG. 2C shows a third configuration of radio transceiver in accordance with an embodiment of the present disclosure.

In a third configuration, a frontend module (FEM) is included, wherein the FEM has a plurality of pins including a bi-directional pin labeled as "A," an input pin labeled as "T," and an output pin labeled as "R." As shown in FIG. 2C, a RFIC 232 is soldered on PCB 231, with the first pin "p1" being connected to the input pin "T" of a frontend module (FEM) 233 via transmission line 235, the second pin "p2" being connected to the output pin "R" of the FEM 233 via transmission line 236, the first pin "p1" being coupled to the second pin "p2" via an on-board component 237, and the bi-directional pin "A" of the FEM 233 being connected to antenna 234 via transmission line 238. This is a one-antenna radio transceiver configuration with potentially better performance than the first configuration 210 of FIG. 2A, if FEM 233 comprise circuits that offer a better performance than circuits in RFIC 232. In practice, additional components can be inserted in any of the three configurations 210, 220, and 230 at a discretion of a radio transceiver designer. For instance, a filter circuit, which comprises an inductor, a capacitor, or a filter module, can be inserted in any of the transmission lines.

RFIC 212, 222, and 232 are the same RFIC but used in different configurations.

Figure 3:
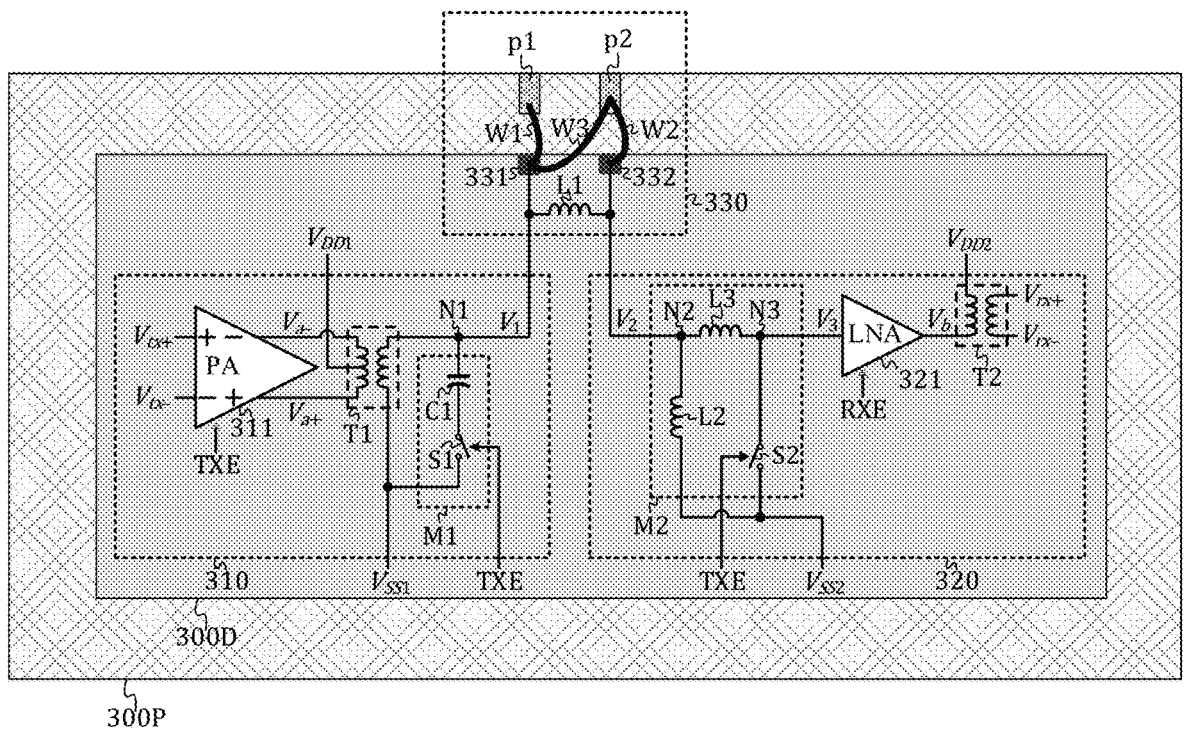
FIG. 3 shows a schematic diagram of a RFIC in accordance with the present disclosure.

A RFIC 300 in accordance with an embodiment of the present disclosure is depicted in FIG. 3. RFIC 300 can be instantiated to embody the RFIC 212 in FIG. 2A, the RFIC 222 in FIG. 2B, and the RFIC 232 in FIG. 2C. The RFIC 300 comprises a die 300D bonded onto a package 300P comprising a plurality of bond-wires (including a first bond-wire W1, a second bond-wire W2, and a third bond-wire W3) and a plurality of pins including a first pin "p1" and a second pin "p2." In terms of functions, the RFIC 300 can be partitioned into three parts: transmitter 310, receiver 320, and co-share network 330. Transmitter 310 and receiver 320 are integrated and fabricated on the die 300D, while the co-share network 330 comprises a combination of on-die components (including a first inductor L1, a first pad 331, and a second pad 332) that are fabricated on the die 300D and in-package components (including the first bond-wire W1, the second bond-wire W2, and the third bond-wire W3). The RFIC 300 are controlled by a first logical signal TXE and a second logical signal RXE; the RFIC 300 is in a transmitter mode when the first logical signal TXE is asserted, and in a receiver mode when the second logical signal RXE is asserted. The first logical signal TXE and the second logical signal RXE cannot be asserted at the same time.

Transmitter 310 operates in accordance with a first power supply domain across a first power supply node $V_{DD1}$ and a first ground node $V_{SS1}$ and is configured to receive a to-be-transmitted signal $V_{tx}$ (which is embodied in a differential signaling scheme and comprising two voltages $V_{tx+}$ and $V_{tx-}$) and output a voltage $V_1$ at a first internal node N1 in accordance with the first logical signal TXE; transmitter 310 is enabled when the first logical TXE is asserted, and disabled otherwise. Transmitter 310 comprises: a power amplifier (PA) 311 controlled by the first logical signal TXE; a first balun transformer T1; and a first matching network M1 comprising a first capacitor C1 and a first switch S1 controlled by the first logical signal TXE. When the first logical signal TXE is asserted, the PA 311 amplifies the to-be-transmitted signal $V_{tx}$ and outputs a first amplified signal $V_a$, (which is embodied in a differential signaling scheme and comprising two voltages $V_{a+}$ and $V_{a-}$), which is transformed into the first voltage $V_1$ via the first balun transformer T1, whose function is two-fold: differential to single-ended conversion, and impedance transformation. The first matching network M1 is configured to shunt the first node N1 to the first ground node $V_{SS1}$ and along with the first balun transformer T1 form a resonant network to boost a gain of the transmitter 310 when the first logical signal TXE is asserted.

Receiver 320 operates in accordance with a second power supply domain across a second power supply node $V_{DD2}$ and a second ground node $V_{SS2}$ and is configured to receive a second voltage $V_2$ at a second internal node N2 and output a received signal $V_{rx}$ (which is embodied in a differential signaling scheme and comprises two voltages $V_{rx+}$ and $V_{rx-}$) in accordance with the first logical signal TXE and a second logical signal RXE; receiver 320 is enabled when the second logical signal RXE is asserted, and disabled otherwise. Receiver 320 comprises: a second matching network M2 controlled by the first logical signal TXE, a low-noise amplifier (LNA) 321 controlled by the second logical signal RXE, and a second balun transformer T2. The second matching network M2 comprises a second inductor L2 configured to shunt the second internal node N2 to the second ground node $V_{SS2}$, a third inductor L3 configured to couple the second internal node N2 to a third internal node N3, and a second switch S2 configured to shunt the third internal node N3 in accordance with the first logical signal TXE and is configured to provide an impedance matching between the second internal node and the third internal node to provide a matching gain so that a third voltage $V_3$ at the third internal node N3 can be greater than the second voltage $V_2$ at the second internal node N2 when the first logical signal TXE is de-asserted. When the second logical signal RXE is asserted, the LNA 321 amplifies the third voltage $V_3$ to output a second amplified signal $V_b$, which is transformed into the received signal $V_3$ (which comprises $V_{rx+}$ and $V_{rx-}$) via the second balun transformer T2, whose function is two-fold: single-ended to differential conversion, and impedance transformation.

The co-share network 330 comprises a combination of on-die components including the first pad 331, the second pad 332, and the first inductor L1 that are fabricated on the die 300D, and in-package components including the first bond-wire W1, the second bond-wire W2, and the third bond-wire W3 that are a part of the package 300P. The first inductor L1 is placed across the first internal node N1 and the second internal node N2, the first pad 331 connects to the first internal node N1, and the second pad 332 connects to the second internal node N2. The first bond-wire W1 bonds the first pad 331 to the first pin "p1," the second bond-wire W2 bonds the second pad 332 to the second pin "p2," and the third bond-wire W3 bonds the first pad 331 to the second pin "p2." The co-share network serves as an interface to the PCB, where the RFIC 300 is soldered on, for both transmitter 310 and receiver 320.

First, consider the transmitter mode. When the RFIC 300 is in the transmitter mode, a purpose of the co-share network 330 is to allow the first voltage $V_1$ at the first internal node N1 to effectively couple to the first pin "p1." There are three coupling paths: a first coupling path is a direct coupling via the first bond-wire W1; a second coupling path is an indirect coupling via the third bond-wire W3 and an on-board component (i.e. the short trace 215 of FIG. 2A, on-board component 227 of FIG. 2B, or on-board component 237 of FIG. 2C) that couples the second pin "p2" to the first pin "p1"; a third coupling path is an indirect coupling via the first inductor L1, the second bond-wire W2, and the on-board component (i.e. the short trace 215 of FIG. 2A, on-board component 227 of FIG. 2B, or on-board component 237 of FIG. 2C) that couples the second pin "p2" to the first pin "p1." The first coupling path provides a strongest coupling since it is a direct coupling, regardless of the configuration in which RFIC 300 is used. The second coupling path provides a weaker coupling and the coupling depends on the configuration in which RFIC 300 is used. The third coupling path is weakest, due to coupling through more components and suffering an energy loss due to a leakage to the receiver 320. The third internal node N3 is shorted to the second ground node $V_{SS2}$ via the second switch S2, and the second inductor L2 and the third inductor L3 jointly form a shunt inductor at the second node N2 that is configured to resonate with a parasitic capacitance at the second pad 332 and thus mitigate the energy loss due to the leakage to the receiver 320. When RFIC 300 is used to embody RFIC 212 in the first configuration 210 of FIG. 2A, the first pin "p1" is shorted to the second pin "p2" via the short trace 215, the second coupling path is still quite appreciable. When RFIC 300 is used to embody RFIC 222 in the second configuration 220 of FIG. 2B, there is an energy loss due to a leakage to antenna 224 via transmission line 223, and the energy loss depends on the on-board component 227. In an embodiment, the on-board component 227 is a capacitor of an impedance that is larger than an impedance of antenna 224 by a factor between two and four. When RFIC 300 is used to embody RFIC 232 in the third configuration 230 of FIG. 2C, there is an energy loss due to a leakage to the receive pin "R" of FEM 236 via transmission line 236, and the energy loss depends on the on-board component 237. In an embodiment, the on-board component 227 is a capacitor of an impedance that is larger than an impedance looking into the receive pin "R" of FEM 236 by a factor between two and four.

Now, consider the receiver mode.

First, consider the case where the RFIC 300 is used to embody RFIC 212 in the first configuration 210, wherein a short trace 215 is used to short the first pin "p1" to the second pin "p2." A purpose of the co-share network 330 is to allow the voltage at the first pin "p1" to effectively couple to the second voltage $V_2$ at the second internal node N2. There are three coupling paths: a first coupling path is a substantially direct path via the second bond-wire W2; a second coupling path is an indirect path via the first bond-wire W1 and the first inductor L1; and a third coupling path is another indirect path via the third bond-wire W3 and the first inductor L1. The first coupling path is the strongest, since it is a substantially direct coupling since the first pin "p1" and the second pin "p2" are shorted. The second coupling path is weaker due to need to couple through the inductor L1 and an energy loss due to a leakage to the transmitter 310. The energy loss due to the leakage to the transmitter 310 is mitigated by de-asserting the first logical signal TXE, effectively turning off the first matching network M1 and causing an impedance looking into the transmitter 310 from the first pad 331 more inductive and resonant with a parasitic capacitance of the first pad 331. The third coupling path resembles the second coupling path but may be slightly weaker due to that the third bond-wire W3 is a cross bond and likely longer the second bond-wire W2.

Next, consider the case where the RFIC 300 is used to embody RFIC 222 in the second configuration 220, wherein an on-board component 227 is used to couple the first pin "p1" to the second pin "p2." A purpose of the co-share network 330 is to allow the voltage at the second pin "p2" to effectively couple to the second voltage $V_2$ at the second internal node N2. There are three coupling paths: a first coupling path is a direct path via the second bond-wire W2; a second coupling path is an indirect path via the third bond-wire W3 and the first inductor L1; and a third coupling path is another indirect path via the on-board component 227, the first bond-wire W1, and the first inductor L1. The first coupling path is the strongest, since it is a direct coupling from the second pin "p2" to the second pad 332. The second coupling path is weaker due to need to couple through the inductor L1 and an energy loss due to a leakage to the transmitter 310 and a leakage to antenna 226 (via the first bond-wire W1 and transmission line 225). The energy loss due to the leakage to the transmitter 310 is mitigated by de-asserting the first logical signal TXE, effectively turning off the first matching network M1 and making an impedance looking into the transmitter 310 from the first pad 331 more inductive and resonant with a parasitic capacitance of the first pad 331. The third coupling path is the weakest, due to the need to couple through the on-board component 227 and the first inductor L1, an energy loss to antenna 226 via the first bond-wire W1 and transmission line 225, and an energy loss due to a leakage to transmitter 310. A net coupling from the second pin "p2" to the second internal node N2 is a superposition of the three coupling paths. In an embodiment, the on-board component 227 is a capacitor, and an impedance of the capacitor is larger than an impedance of antenna 226 by a factor between two to four.

Now, consider the case where the RFIC 300 is used to embody RFIC 222 in the third configuration 230, wherein an on-board component 237 is used to couple the first pin "p1" to the second pin "p2." As far as a function of the RFIC 300 is concerned, the third configuration 230 is the same as the second configuration 220, except that the transmit pin "T" and the receive pin "R" of FEM 233 replace antenna 226 and antenna 224, respectively. Whatever coupling mechanism and paths described in the case where the RFIC 300 is used to embody RFIC 222 in the second configuration 220 apply to the case where the RFIC 300 is used to embody RFIC 232 in the third configuration 230.

In both the transmitter mode and the receive mode, the co-share network 330 comprises multiple parallel paths, each comprising multiple components, that can be designed in accordance with a frequency range of interest, offers a high degree of design freedom.

Figure 4:
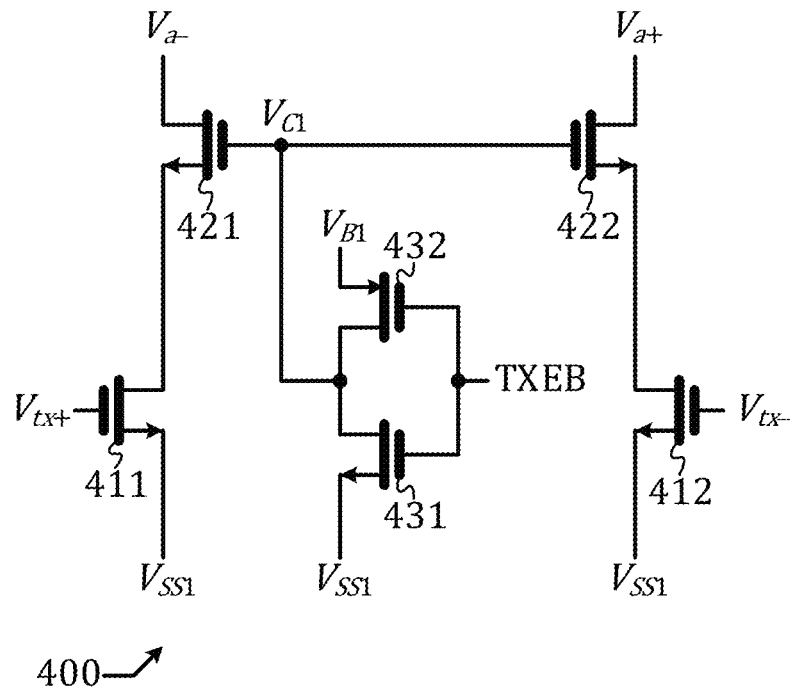
FIG. 4 shows a schematic diagram of a power amplifier.

A schematic diagram of a power amplifier 400 that can embody PA 311 of FIG. 3 is depicted in FIG. 4. Power amplifier 400 comprises: NMOS transistors 411, 412, 421, 422, and 431, and PMOS transistor 432. NMOS transistors 411 and 412 are identical and form a pseudo differential common-source amplifier pair, while NMOS transistors 421 and 422 are identical and form a cascode pair. $V_{C1}$ denotes a gate voltage for NMOS transistors 421 and 422. $V_{B1}$ denotes a bias voltage that is higher than a threshold voltage of NMOS transistors 421 and 422. NMOS transistor 431 and PMOS transistor 432 transistor form an inverter. TXEB denotes a logical inversion of the first logical signal TXE. When TXE is asserted (i.e. high), TXEB is low due to the logical inversion, and the gate voltage $V_{C1}$ is pulled up to $V_{B1}$ by PMOS transistor 432, thus turning on NMOS transistors 421 and 422 and allow NMOS transistors 411 and 412 to amplify $V_{tx+}$ and $V_{tx-}$ and output $V_{a-}$ and $V_{a+}$ via NMOS transistors 421 and 422, respectively. When TXE is de-asserted (i.e. low), TXEB is high due to the logical inversion, and the gate voltage $V_{C1}$ is pulled down to ground $V_{SS1}$ by NMOS transistor 431, thus turning off NMOS transistors 421 and 422 and effectively shutting off NMOS transistors 411 and 412. Power amplifier 400 is well known in the prior art and therefore no further description is given here.

Figure 5:
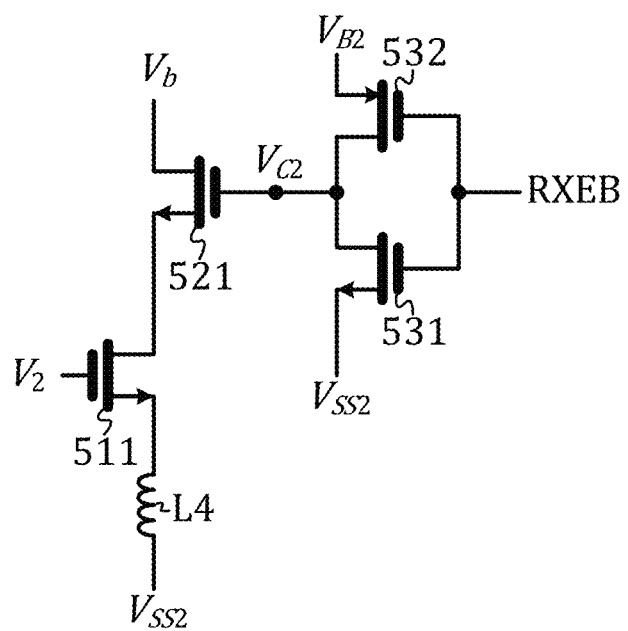
FIG. 5 shows a schematic diagram of a low-noise amplifier.

A schematic diagram of a low-noise amplifier 500 that can embody LNA 321 of FIG. 3 is depicted in FIG. 5. Low-noise amplifier 500 comprises: NMOS transistors 511, 521, and 531, PMOS transistor 532, and an inductor L4. NMOS transistors 511 functions as a common-source amplifier, NMOS transistors 521 functions as a cascode device, while inductor L4 provides a source degeneration for NMOS transistor 511. $V_{C2}$ denotes a gate voltage for NMOS transistor 521. $V_{B2}$ denotes a bias voltage that is higher than a threshold voltage of NMOS transistor 521. NMOS transistor 531 and PMOS transistor 532 form an inverter. RXEB denotes a logical inversion of the first logical signal RXE. When RXE is asserted (i.e. high), RXEB is low due to the logical inversion, and the gate voltage $V_{C2}$ is pulled up to $V_{B2}$ by PMOS transistor 532, thus turning on NMOS transistors 521 and allowing NMOS transistors 511 to amplify $V_2$ and output $V_b$ via NMOS transistor 521. When RXE is de-asserted (i.e. low), RXEB is high due to the logical inversion, and the gate voltage $V_{C2}$ is pulled down to ground ($V_{SS2}$) by NMOS transistor 531, thus turning off NMOS transistors 521 and effectively shutting off NMOS transistors 511. Low-noise amplifier 500 is well known in the prior art and therefore no further description is given here.

A frontend module such as FEM 233 integrates a power amplifier, a low-noise amplifier, and a duplexing circuit, which is usually a single pole double throw switch. Frontend modules are readily commercially available from many sources and are well understood by those of ordinary skills in the art and thus described in detail here.

There are many more circuits integrated on die 300D of RFIC 300, including circuits that generate the to-be-transmitted signal $V_{tx}$ and circuits that further process the received signal $V_{rx}$. Likewise, there are many additional pins on package 300P, many additional pads on die 300D, and many additional bond-wires configured to bond said many additional pads to say many additional pins to allow circuits on die 300D to interface with the PCB where RFIC 300 is soldered on. These are obvious to those of ordinary skills in the art and thus not described in detail to avoid obscuring aspects of this present disclosure.

The transmitter 310 and the receiver 320 work in different power domains for a purpose of reducing a coupling via power supply nodes or ground nodes. By way of example but not limitation, $V_{DD1}$ is 3.3V; $V_{DD2}$ is 1.05V; the package 300P is a 88-pin QFN (quad flat no-lead) package; the first bond-wire W1 is approximately 1.3 mm long; the second bond-wire W2 is approximately 1.3 mm long; the third bond-wire W3 is approximately 1.6 mm long; a frequency of the to-be-transmitted signal $V_{tx}$ is the same as a frequency of the received signal $V_{rx}$ and is between 4.9 GHz and 7.2 GHz; the first inductor L1 is 1 nH; the second inductor L2 is 3.5 nH; the third inductor L3 is 1 nH; and the first capacitor C1 is 300 fF.

Figure 6:
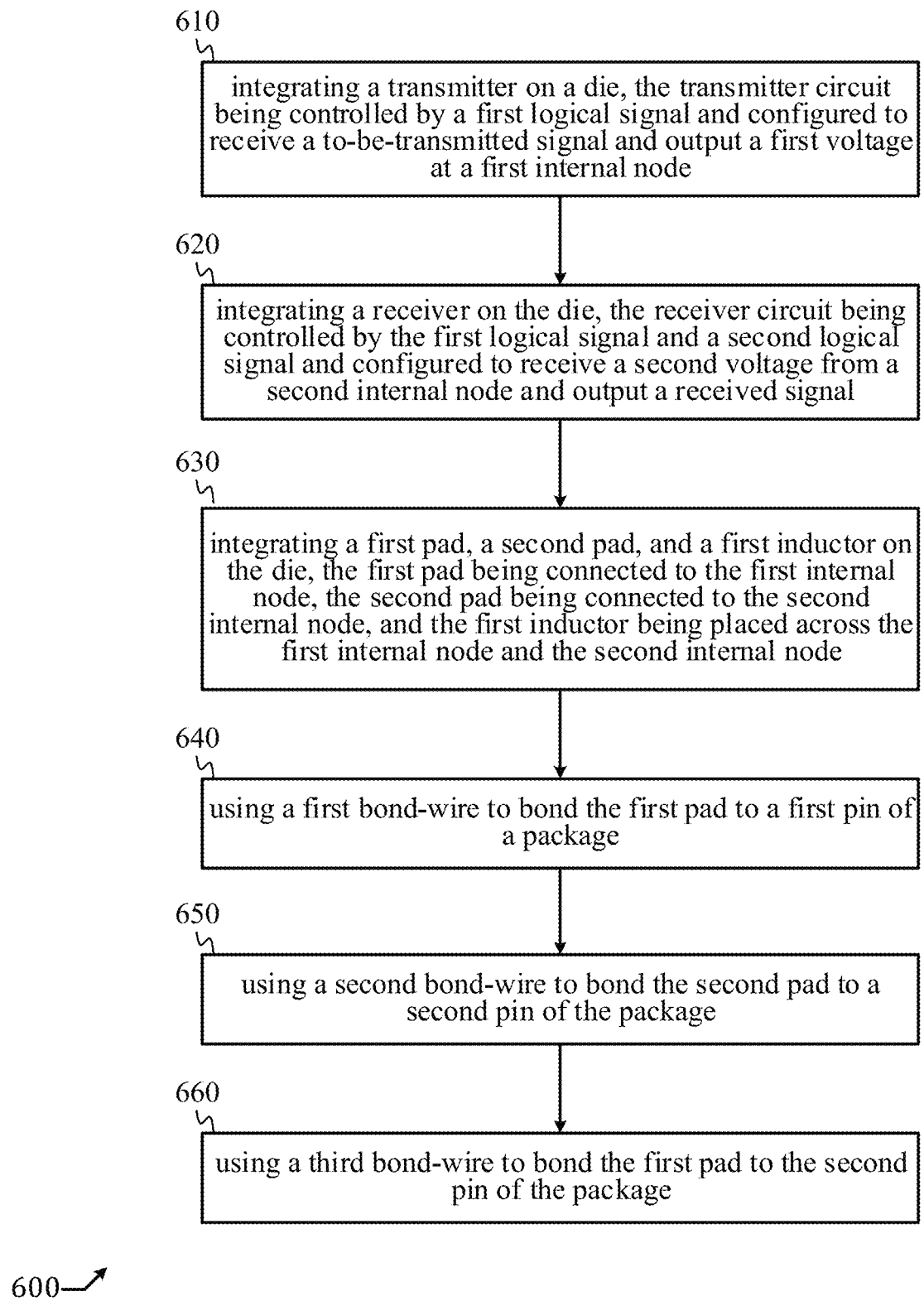
FIG. 6 shows a flow diagram of a method in accordance with the present disclosure.

As illustrated by a flow diagram shown in FIG. 6, a method of integrating a RFIC comprises: (step 610) integrating a transmitter on a die, the transmitter circuit being controlled by a first logical signal and configured to receive a to-be-transmitted signal and output a first voltage at a first internal node; (step 620) integrating a receiver on the die, the receiver circuit being controlled by the first logical signal and a second logical signal and configured to receive a second voltage from a second internal node and output a receive signal; (step 630) integrating a first pad, a second pad, and a first inductor on the die, the first pad being connected to the first internal node, the second pad being connected to the second internal node, and the first inductor being placed across the first internal node and the second internal node; (step 640) using a first bond-wire to bond the first pad to a first pin of a package; (step 650) using a second bond-wire to bond the second pad to a second pin of the package; and (step 660) using a third bond-wire to bond the first pad to the second pin of the package.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A radio frequency integrated circuit (RFIC) comprising:
    a transmitter integrated on a die, the transmitter being controlled by a first logical signal and configured to receive a to-be-transmitted signal and output a first voltage at a first internal node;
    a receiver integrated on the die, the receiver circuit being controlled by the first logical signal and a second logical signal and configured to receive a second voltage from a second internal node and output a received signal;
    a first pad, a second pad, and a first inductor integrated on the die, the first pad being connected to the first internal node, the second pad being connected to the second internal node, and the first inductor being placed across the first internal node and the second internal node;
    a first bond-wire bonding the first pad to a first pin of a package;
    a second bond-wire bonding the second pad to a second pin of the package, and
    a third bond-wire bonding the first pad to the second pin of the package.

2. The RFIC of claim 1, wherein the transmitter is enabled and configured to work in a first power domain across a first power supply node and a first ground node when the first logical signal is asserted, the receiver is enabled and configured to work in a second power domain across a second power supply node and a second ground node when the second logical signal is asserted, and the first logical signal and the second logical signal are not asserted at the same time.

3. The RFIC of claim 2, wherein: the transmitter comprises a power amplifier configured to amplify the to-be-transmitted signal into a first amplified signal when the first logical signal is asserted, a first balun transformer configured to transform the first amplified signal into the first voltage at the first internal node, and a first matching network comprising a first capacitor in series with a first switch controlled by the first logical signal and configured to shunt the first internal node to the first ground via the capacitor when the first logical signal is asserted.

4. The RFIC of claim 2, wherein: the receiver comprises a second matching network configured to provide an impedance matching between the second internal node and a third internal node, a low-noise amplifier configured to amplify a third voltage at the third internal node into a second amplified signal when the second logical signal is asserted, and a second balun transformer configured to transform the second amplified signal into the received signal.

5. The RFIC of claim 4, wherein the second matching network comprises a second inductor configured to shunt the second node to the second ground node, a third inductor placed across the second internal node and the third internal node, and a second switch controlled by the first logical signal and configured to shunt the third node to the second ground node when the first logical signal is asserted.

6. The RFIC of claim 2 being soldered on a printed circuit board (PCB) via the first pin and the second pin.

7. The RFIC of claim 6, wherein the PCB comprises a short trace configured to short the first pin to the second pin, and a transmission line configured to connect the first pin to an antenna.

8. The RFIC of claim 6, wherein the PCB comprises an on-board component configured to couple the first pin to the second pin.

9. The RFIC of claim 8, wherein the PCB further comprises a first transmission line configured to connect the first pin a first antenna and a second transmission line configured to connect the second pin to a second antenna.

10. The RFIC of claim 8, wherein the PCB further comprises a first transmission line configured to connect the first pin to a transmitter pin of a frontend module, and a second transmission line configured to connect the second pin to a receiver pin of said frontend module.

11. A method of integrating a radio frequency integrated circuits (RFIC) comprising:
    integrating a transmitter on a die, the transmitter being controlled by a first logical signal and configured to receive a to-be-transmitted signal and output a first voltage at a first internal node;
    integrating a receiver on the die, the receiver being controlled by the first logical signal and a second logical signal and configured to receive a second voltage from a second internal node and output a received signal;
    integrating a first pad, a second pad, and a first inductor on the die, the first pad being connected to the first internal node, the second pad being connected to the second internal node, and the first inductor being placed across the first internal node and the second internal node;
    using a first bond-wire to bond the first pad to a first pin of a package;
    using a second bond-wire to bond the second pad to a second pin of the package; and
    using a third bond-wire to bond the first pad to the second pin of the package.

12. The method of integrating a RFIC of claim 11, wherein the transmitter is enabled and configured to work in a first power domain across a first power supply node and a first ground node when the first logical signal is asserted, the receiver is enabled and configured to work in a second power domain across a second power supply node and a second ground node when the second logical signal is asserted, and the first logical signal and the second logical signal are not asserted at the same time.

13. The method of integrating a RFIC of claim 12, wherein: the transmitter comprises a power amplifier configured to amplify the to-be-transmitted signal into a first amplified signal when the first logical signal is asserted, a first balun transformer configured to transform the first amplified signal into the first voltage at the first internal node, and a first matching network comprising a first capacitor in series with a first switch controlled by the first logical signal and configured to shunt the first internal node to the first ground via the capacitor when the first logical signal is asserted.

14. The method of integrating a RFIC of claim 12, wherein: the receiver comprises a second matching network configured to provide an impedance matching between the second internal node and a third internal node, a low-noise amplifier configured to amplify a third voltage at the third internal node into a second amplified signal when the second logical signal is asserted, and a second balun transformer configured to transform the second amplified signal into the received signal.

15. The method of integrating a RFIC of claim 14, wherein the second matching network comprises a second inductor configured to shunt the second node to the second ground node, a third inductor placed across the second internal node and the third internal node, and a second switch controlled by the first logical signal and configured to shunt the third node to the second ground node when the first logical signal is asserted.

16. The method of integrating a RFIC of claim 12 being soldered on a printed circuit board (PCB) via the first pin and the second pin.

17. The method of integrating a RFIC of claim 16, wherein the PCB comprises a short trace configured to short the first pin to the second pin, and a transmission line configured to connect the first pin to an antenna.

18. The method of integrating a RFIC of claim 16, wherein the PCB comprises an on-board component configured to couple the first pin to the second pin.

19. The method of integrating a RFIC of claim 18, wherein the PCB further comprises a first transmission line configured to connect the first pin a first antenna and a second transmission line configured to connect the second pin to a second antenna.

20. The method of integrating a RFIC of claim 18, wherein the PCB further comprises a first transmission line configured to connect the first pin to a transmitter pin of a frontend module, and a second transmission line configured to connect the second pin to a receiver pin of said frontend module.

* * * * *